: US008197638B2

(12) United States Patent
Ishisaka et al.

(10) Patent No.: US 8,197,638 B2
(45) Date of Patent: Jun. 12, 2012

(54) SEMICONDUCTOR MANUFACTURING DEVICE AND METHOD FOR MANUFACTURING SEMICONDUCTOR DEVICES

(75) Inventors: Mitsunori Ishisaka, Toyama (JP); Toshimitsu Miyata, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1151 days.

(21) Appl. No.: 10/589,490

(22) PCT Filed: Mar. 4, 2005

(86) PCT No.: PCT/JP2005/003730
§ 371 (c)(1),
(2), (4) Date: May 22, 2007

(87) PCT Pub. No.: WO2005/093806
PCT Pub. Date: Oct. 6, 2005

(65) Prior Publication Data
US 2008/0017111 A1 Jan. 24, 2008

(30) Foreign Application Priority Data

Mar. 26, 2004 (JP) .................................. 2004-093341

(51) Int. Cl.
*H01L 21/00* (2006.01)
*C23C 14/00* (2006.01)
*C23C 16/00* (2006.01)
(52) U.S. Cl. ................... 156/345.51; 118/728; 361/234; 279/128
(58) Field of Classification Search ............... 118/723 E, 118/724, 725, 728; 156/345.43, 345.44, 156/345.45, 345.46, 345.47, 345.51, 345.52, 156/345.53; 361/234; 279/128; 269/27
See application file for complete search history.

(56) References Cited

U.S. PATENT DOCUMENTS

| 5,423,971 | A | * | 6/1995 | Arnold et al. | 204/298.11 |
| 5,462,603 | A | * | 10/1995 | Murakami | 118/719 |
| 5,561,585 | A | * | 10/1996 | Barnes et al. | 361/234 |
| 5,688,331 | A | * | 11/1997 | Aruga et al. | 118/725 |
| 5,886,863 | A | * | 3/1999 | Nagasaki et al. | 361/234 |
| 6,462,928 | B1 | * | 10/2002 | Shamouilian et al. | 361/234 |
| 6,646,233 | B2 | * | 11/2003 | Kanno et al. | 219/390 |

(Continued)

FOREIGN PATENT DOCUMENTS
JP 7-11446 1/1995
(Continued)

*Primary Examiner* — Ram Kackar
*Assistant Examiner* — Anna Crowell
(74) *Attorney, Agent, or Firm* — Kratz, Quintos & Hanson, LLP

(57) ABSTRACT

Wafer contamination is prevented, while preventing damage to a high-frequency electrode and a susceptor. A main body 41 of the susceptor 40 of an MMT apparatus is composed of a heater arranging plate 42, an electrode arranging plate 48, and a supporting plate 56 all made from quartz. A circular electrode arranging hole 49 with a fixed depth is concentrically formed on the upper surface of the electrode arranging plate 48, and quadrangular pillars 50 are formed protruding in a matrix on the bottom of the electrode arranging hole 49. Multiple insertion holes 52 are formed in a disk-shaped high-frequency electrode 51, and the high-frequency electrode 51 is installed in the electrode arranging hole 49 by inserting each pillar 50 into each insertion hole 52. The gaps Sa and Sb are provided between the high-frequency electrode 51 and the electrode arranging plate 48. The pillar 50 boosts the strength of the electrode arranging plate 48. Damage to the high-frequency electrode is prevented even if the thermal expansion coefficient of the high-frequency electrode is larger than that of the electrode arranging plate, since the gaps absorb the thermal expansion differential.

5 Claims, 3 Drawing Sheets

U.S. PATENT DOCUMENTS

| | | | |
|---|---|---|---|
| 7,430,104 B2 * | 9/2008 | Litman et al. | 361/234 |
| 7,842,160 B2 * | 11/2010 | Kasanami et al. | 156/345.51 |
| 2002/0137334 A1 * | 9/2002 | Watanabe et al. | 438/677 |
| 2006/0151117 A1 * | 7/2006 | Kasanami et al. | 156/345.52 |
| 2008/0223524 A1 * | 9/2008 | Kasanami et al. | 156/345.51 |

FOREIGN PATENT DOCUMENTS

| | | |
|---|---|---|
| JP | 9-45624 | 2/1997 |
| JP | 2000-349141 | 12/2000 |
| WO | WO 2004095560 A1 * | 11/2004 |

* cited by examiner

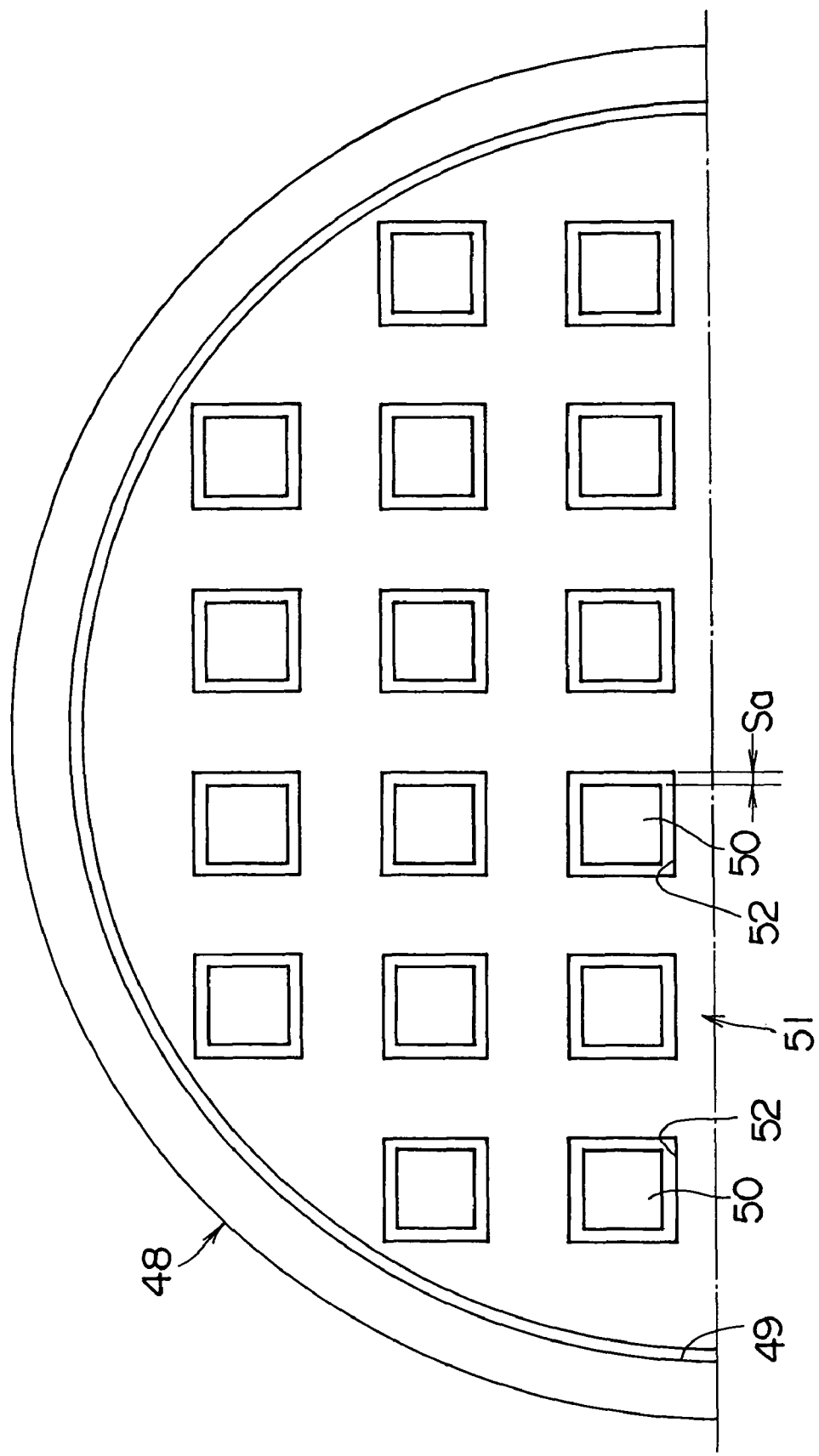

SEMICONDUCTOR MANUFACTURING DEVICE AND METHOD FOR MANUFACTURING SEMICONDUCTOR DEVICES

TECHNICAL FIELD

The present invention relates to a semiconductor manufacturing device and a method for manufacturing semiconductor devices, and relates to a manufacturing method for semiconductor integrated circuit devices (hereafter called IC) effective for example in plasma processing including oxidizing, nitriding, diffusing, film-forming, and etching of the semiconductor wafer (hereafter called wafer) to form the integrated circuit containing semiconductor elements.

BACKGROUND ART

In IC manufacturing methods, the wafer is treated with plasma by a plasma processing device (hereafter called MMT apparatus) utilizing a modified magnetron type plasma source that generates a high-density plasma by means of an electrical field and a magnetic field.

The MMT apparatus includes a processing chamber, a susceptor, a cylindrical electrode, a cylindrical magnet, a shower head, and an exhaust vent. To perform plasma processing, a wafer serving as the substrate to be processed is mounted on the susceptor in the processing chamber maintained in an air-tight state. Reactive gas is supplied into the processing chamber via a shower plate and the processing chamber is maintained at a specified pressure. An electrical field and a magnetic field are formed by supplying high-frequency electrical power to the cylindrical electrode to induce magnetron discharge. At this time, electrons discharged from the cylindrical electrode rotate in a continual cycloid movement while drifting, the ionization rate is boosted due to a longer electron life and high-density plasma is generated. The MMT apparatus in this way, excites and breaks down reactive gas for plasma processing including oxidizing, nitriding, diffusing, film-forming, and etching of the wafer surface (for example in patent document 1).

In conventional MMT apparatuses, the susceptor is usually manufactured from aluminum nitride (AlN). Also in conventional MMT apparatuses, the susceptor sometimes contains a heater for heating the wafer, and a high-frequency electrode for applying a bias voltage. The high-frequency electrode incidentally is formed in a lattice shape (mesh shape) from material with a high melting point such as molybdenum (Mo).
Patent document 1: Japanese Patent Non-Examined Publication No. 2001-196354

DISCLOSURE OF INVENTION

MMT apparatuses whose susceptor is fabricated from aluminum nitride possess the problem that the wafer becomes contaminated since the susceptor generates aluminum impurities (contaminants) during plasma processing. Moreover, the wafer makes contact with the susceptor over a wide surface area, causing the problem that aluminum from the susceptor contaminates the rear surface of the wafer.

In order to resolve these problems, usually at least the susceptor surface for supporting the wafer is formed from quartz.

However, MMT apparatuses whose susceptor contains a heater and a high-frequency electrode possess the following problems.

1) The difference in thermal expansion coefficients between the high melting point material of the high-frequency electrode and the quartz of the susceptor causes stress that damages the lattice-shaped high-frequency electrode.

2) The width for bonding the susceptor main member and the quartz member of the susceptor which makes contact with the wafer is only a small narrow section of the outer side width of the high-frequency electrode so that the quartz material is damaged due to the pressure differential (differential between atmospheric pressure and processing pressure) between inside and outside of the susceptor if for example the quartz member thickness is set to approximately 1.5 millimeters. The distance from the wafer rear surface to the high-frequency electrode is preferably short in order to apply a bias voltage.

The object of the present invention is to provide a semiconductor manufacturing device capable of preventing contamination on the substrate for processing, while preventing damage to the high-frequency electrode and susceptor.

A semiconductor manufacturing device of the present invention comprises a processing chamber including a susceptor for supporting a substrate, wherein the susceptor has a main body containing a wall forming inside an electrode arranging space substantially flat and parallel to the substrate and multiple pillars joining the bottom and ceiling of the wall; and a high-frequency electrode installed with a gap between the electrode and at least the wall or at least the pillar within the electrode arranging space.

The present invention can prevent damage to the high-frequency electrode because even if the thermal expansion coefficient of the high-frequency electrode material is larger than the thermal expansion coefficient of the susceptor main body material, the thermal expansion differential is absorbed by the gaps provided between the high-frequency electrode and the electrode arranging space. Damage to the susceptor main body can be also prevented since the strength of the electrode arranging space is reinforced by the pillars.

BRIEF DESCRIPTION OF DRAWINGS

FIG. 3 is a partial omitted plan view taken along line III-III of FIG. 2.

BEST MODE FOR CARRYING OUT THE INVENTION

One embodiment of the present invention will be described next while referring to drawings.

Figure 1:
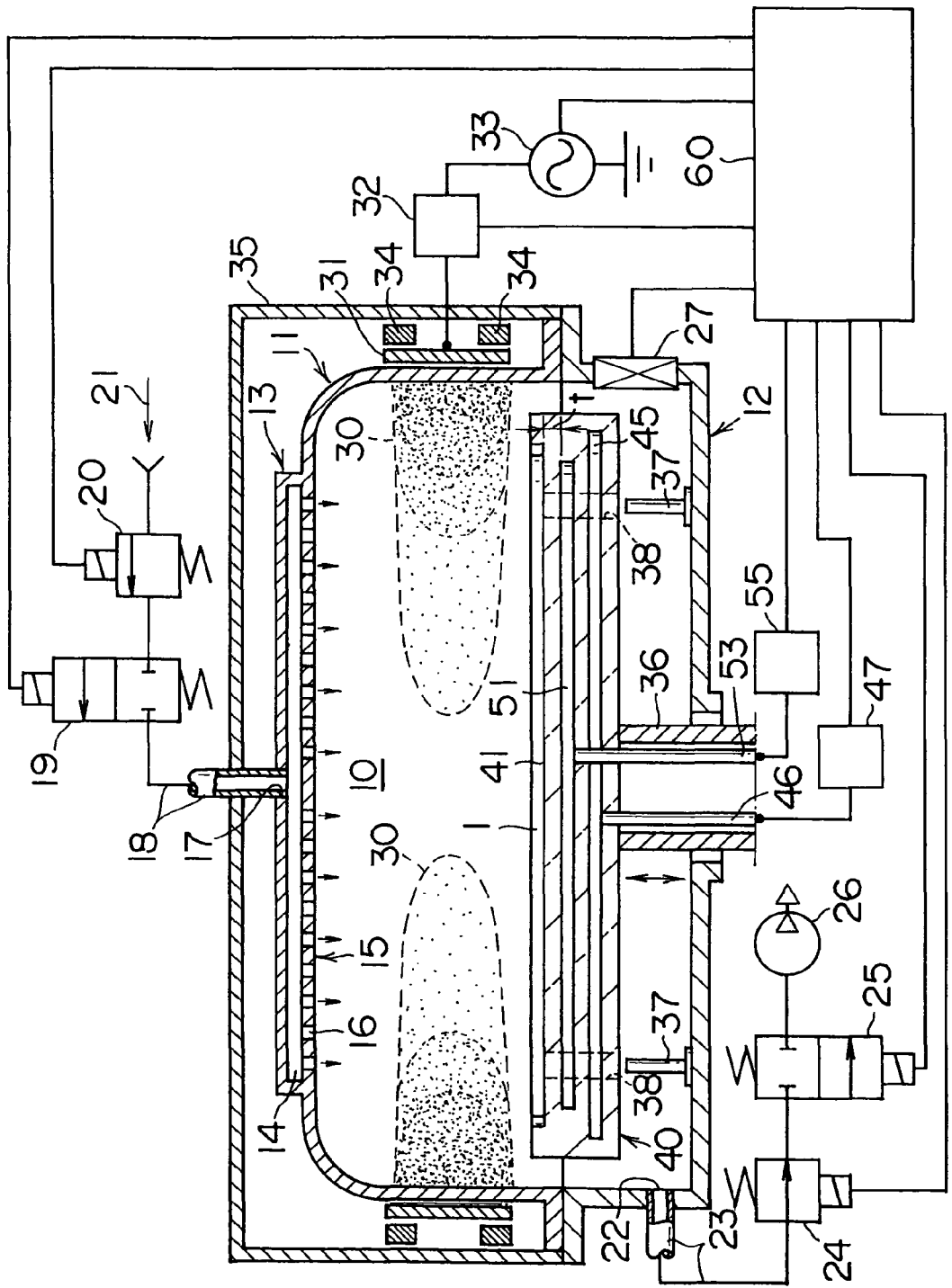
FIG. 1 is a frontal cross sectional view showing the MMT apparatus of an embodiment of the present invention.

In this embodiment, the semiconductor manufacturing device of this invention is structured as the MMT apparatus shown in FIG. 1. The MMT apparatus of FIG. 1 contains a processing chamber 10. The processing chamber 10 is enclosed by an upper container 11 and lower container 12. The upper container 11 is formed in a dome shape using aluminum oxide or quartz. The lower container 12 is formed in a circular saucer shape using aluminum. A shower head 13 forming a buffer chamber 14 serving as a gas dispersion space is provided at the top section of the upper container 11. The lower wall of the shower head 13 is formed by a shower plate 15 containing gas spray holes 16 as spray outlets for spraying out gas. A gas inlet 17 serving as an inlet for supplying gas is formed in the upper wall of the shower head 13. A gas supply pipe 18 serving as a supply pipe for supplying gas, is connected to the gas inlet 17. The gas supply pipe 18 is connected via a valve 19 serving as a switching valve, and a mass flow controller 20 serving as the flow rate control means, to a gas tank (not shown in drawing) of a reactive gas 21. An exhaust vent 22 for evacuating the reactive gas 21 is formed on the side wall of the lower container 12. The exhaust vent 22 is connected via an exhaust pipe 23 to a vacuum pump 26. A valve 25 serving as a switching valve and a pressure regulator valve 24 are installed in the exhaust pipe 23. A gate valve 27 serving as a stop valve is installed at another position on the side wall of the lower container 12. A wafer 1 is loaded in and unloaded out of the processing chamber 10 by a wafer transfer device (not shown in drawing), when the gate valve 27 is open. The processing chamber 10 is maintained in an air-tight state when the gate valve 27 is closed.

A first electrode 31 functioning as a discharge means to excite the supplied reactive gas 21 is installed on the outer side of the upper container 11. The first electrode 31 is formed in a tubular shape and preferably is formed in a cylindrical shape. The first electrode 31 is arranged concentric with the upper container 11 so as to enclose a plasma generating region 30 in the processing chamber 10. A high-frequency power source 33 for applying high-frequency power is connected via a matching device 32 for matching the impedance, to the first electrode 31 (hereafter called tubular electrode). A pair of permanent magnets 34 serving as a magnetic field forming means are installed at above and below on the outer side of the tubular electrode 31. The permanent magnets 34 are formed in a tubular shape and preferably are formed in a cylindrical shape. The upper and lower permanent magnets (hereafter tubular magnets) 34, 34 are concentrically arranged in the vicinity of the upper and lower ends on the outer side surface of the tubular electrode 31. The upper and lower tubular magnets 34, 34 possess a magnetic polarity on both ends (inner circumferential and outer circumferential end) along the radial direction of the processing chamber 10. The polarity of these upper and lower tubular magnets 34, 34 are set facing opposite directions. These magnets are therefore of mutually different polarities on their inner circumferential sections and generate magnetic lines of force on the cylindrical axis along the inner circumferential surface of the tubular electrode 31. A shield plate 35 is installed on the periphery of the tubular electrode 31 and the tubular magnet 34 for effectively blocking the electrical field and magnetic field. The shield plate 35 blocks the electrical field and magnetic field formed by the tubular electrode 31 and the tubular magnet 34 to prevent exerting adverse effects on the external environment and other semiconductor manufacturing devices, etc.

A susceptor elevating shaft 36 is supported in the center of the lower container 12 to rise and lower vertically by means of an elevator (not shown in drawing). A susceptor 40 is installed horizontally on the upper end on the processing chamber 10 side of the susceptor elevating shaft 36. The susceptor elevating shaft 36 is insulated from the lower container 12. Three push-up pins 37 are installed perpendicularly on the outer side of the susceptor elevating shaft 36 on the bottom of the lower container 12. Insertion holes 38 are formed at three positions respectively corresponding to each push-up pin 37 of the susceptor 40 to allow insertion in the upper and lower directions. When the susceptor elevating shaft 36 lowers, the three push-up pins 37 insert from below into the three insertion holes 38 formed on the susceptor 40 and push up the wafer 1 supported on the susceptor 40.

Figure 2:
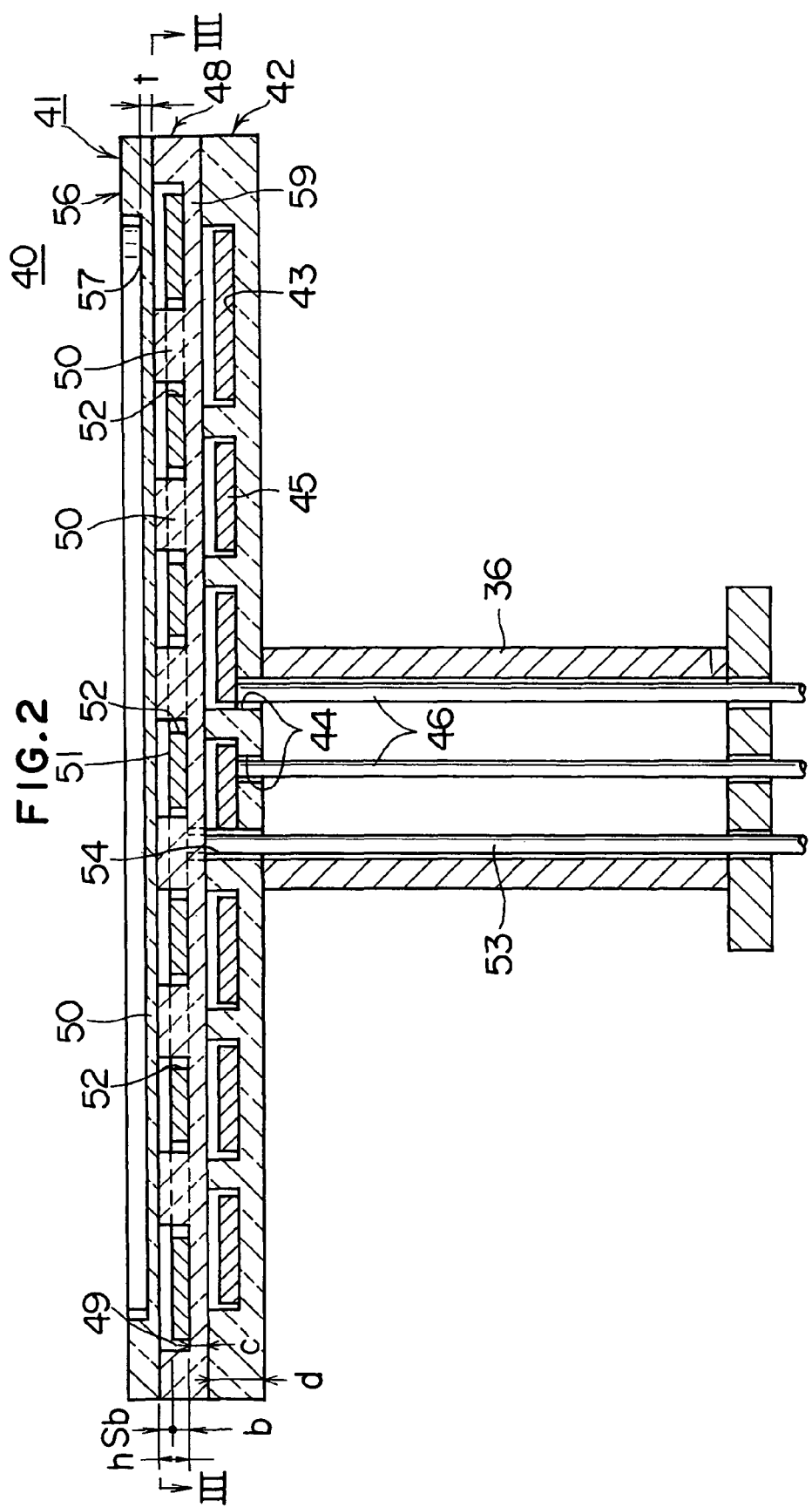
FIG. 2 is a frontal cross sectional view showing the susceptor.

The susceptor 40 as shown in FIG. 2, has a main body 41 formed from three plates all made from quartz and stacked in three layers. The main body 41 is formed in a disk shape having an outer diameter larger than the outer diameter of the wafer 1. The susceptor elevating shaft 36 supports the main body 41. A heater arranging groove 43 is formed in a whirl shape on the upper surface of a plate (hereafter called heater arranging plate) 42 located on the lowest stage of the main body 41. A whirl-shaped heater 45 is installed in the space of the heater arranging groove 43. The lower surface of the heater arranging plate 42 is the rear side of the susceptor 40. Here, d is the overall thickness of the heater arranging plate 42.

The heater 45 is formed from silicon carbide. The heater 45 is structured to heat the wafer 1 to approximately 500 degrees centigrade by application of the high-frequency electrical power. A pair of power feed lines 46, 46 are connected to the start terminal and end terminal of the heater 45 by insertion into each of insertion holes 44, 44. Both of the power feed lines 46, 46 are inserted through the susceptor elevating shaft 36 and drawn through to the outer side. These power feed lines 46, 46 are connected to a heater high-frequency power supply 47 as shown in FIG. 1. A plate (hereafter called electrode arranging plate) 48 located at the intermediate level is stacked on the heater arranging plate 42 so that the space of the heater arranging groove 43 is sealed air-tight. The surface where the heater arranging plate 42 joins to the electrode arranging plate 48 is secured by adhesive material or by heat welding.

A circular electrode arranging hole 49 is formed at a fixed depth (See FIG. 2.) concentrically on the upper surface of the circular electrode arranging plate 48 as shown in FIG. 3. Quadrangular pillars 50 with a fixed height (See FIG. 2.) and a square shape as seen from a plan view are arranged in a matrix on the bottom surface of the electrode arranging hole 49. A high-frequency electrode 51 for applying a bias voltage is installed in the electrode arranging space formed by the electrode arranging hole 49. The high-frequency electrode 51 is formed in a disk shape using platinum (Pt) serving as the metallic material which has little resistance and is resistant to oxidation. As shown in FIG. 2, when the plate thickness of the high-frequency electrode 51 is defined as b, and the height of the electrode arranging hole 49 is defined as h, the plate thickness b of the high-frequency electrode 51 is set smaller than the height h of the electrode arranging hole 49. The plate thickness of a high-frequency electrode supporting section 59 where the electrode arranging hole 49 is arranged and the high-frequency electrode 51 is supported is defined as c. As shown in FIG. 3, multiple insertion holes 52 are formed with a diameter larger than the outer diameter of the pillar 50 in a square shape in the high-frequency electrode 51. Inserting each of the respective pillars 50 in the insertion holes 52 installs the high-frequency electrode 51 in the electrode arranging plate 48 stored in the electrode arranging hole 49. The diameter of the insertion hole 52 or in other words, the inner diameter, is set larger than the outer diameter of the pillar 50 so that a gap Sa is formed between the inner circumference of the insertion hole 52 and the outer circumference of the pillar 50. The insertion holes 52 are arranged in a matrix corresponding to the pillars 50, and the distribution of their opening surface area is set as uniform as possible across the entire high-frequency electrode 51.

A high-frequency feed line 53 is inserted into an insertion hole 54 and connects to the high-frequency electrode 51. The high-frequency feed line 53 is inserted through the susceptor elevating shaft 36 and drawn out to an outside section. An impedance adjuster 55 to adjust the impedance, connects to the high-frequency feed line 53. The impedance adjuster 55 is comprised of a coil and variable capacitor. The voltage applied to the wafer 1 via the susceptor 40 is controlled by regulating the number of coil patterns and the capacitance value of the variable capacitor.

A plate (hereafter called supporting plate) 56 located at the topmost level is stacked on the electrode arranging plate 48 so as to seal the space of the electrode arranging hole 49 in an air-tight state. The surface where the supporting plate 56 joins to the electrode arranging plate 48 is secured by adhesive material or by heat welding. The upper surface of each of the pillars 50 of the electrode arranging plate 48 is in this state fixed to the lower surface of the supporting plate 56. As shown in FIG. 2, a gap Sb separates the upper surface of the high-frequency electrode 51 from the lower surface of the supporting plate 56.

A supporting section 57 containing a supporting surface for positioning and supporting the wafer 1 is formed on the upper surface of the supporting plate 56. The supporting section 57 is formed in a circular hole shape of a fixed depth with a diameter larger than the outer diameter of the wafer 1. The supporting surface of the supporting section 57 is formed on the surface of the susceptor 40. Defining the plate thickness of the supporting section 57 in the supporting plate 56 contacting the wafer 1 as t, the plate thickness t of the supporting section 57 is thinner than the periphery of the supporting plate 56, or in other words the total thickness of the supporting plate 56. The plate thickness t of the supporting section 57 and the gap Sb are set so that the gap between the lower surface of the wafer 1 and the high-frequency electrode 51 is 1.5 millimeters or less. The distance from the upper surface of the high-frequency electrode 51 to the supporting surface for supporting the wafer 1 mounted on the surface of the susceptor 40 higher than the high-frequency electrode 51, is set to small distance compared to the distance to the rear side of the susceptor 40 on the side lower than the lower surface of the high-frequency electrode 51. The plate thickness t of the supporting section 57 is made thinner than the plate thickness c of the high-frequency electrode supporting section 59 and the total thickness d of the heater arranging plate 42.

The MMT apparatus as shown in FIG. 1, includes a controller 60 serving as the regulator means made up of a computer, etc. The controller 60 is connected to and regulates the valve 19, the mass flow controller 20, the pressure regulator valve 24, the valve 25, the vacuum pump 26, the gate valve 27, the matching device 32, the high-frequency power supply 33, a drive device for the susceptor elevating shaft 36, the impedance adjuster 55, and the heater high-frequency power supply 47, etc.

The function of the MMT apparatus structure as explained above is described next.

The wafer 1 is carried by a wafer transfer device from the gate valve 27, into the processing chamber 10 and loaded on the supporting section 57 of the susceptor 40. In this case, the susceptor elevating shaft 36 lowers the susceptor 40, the tip of the push-up pin 37 inserts into the insertion hole 38 of the susceptor 40, and protrudes up to just a specified height higher than the upper surface of the susceptor 40. The gate valve 27 installed in the lower container 12 then opens, the wafer transfer device carries in the wafer 1, and loads it on the top end of the three push-up pins 37. When the wafer transfer device that transferred the wafer 1 to the push-up pin 37 retracts to outside the processing chamber 10, the gate valve 27 closes, the susceptor elevating shaft 36 raises the susceptor 40, and the wafer 1 is conveyed from the push-up pins 37 to the supporting section 57 of the susceptor 40.

The heater 45 of the susceptor 40 is preheated and heats the wafer 1 supported on the supporting section 57 of the susceptor 40, to a specified processing temperature within a range from room temperature to 500 degrees centigrade. The vacuum pump 26 and the pressure adjuster valve 24 maintain the pressure in the processing chamber 10 within a range from 0.1 through 100 Pa. When the wafer 1 is heated to the processing temperature, the reactive gas 21 is supplied from the gas inlet 17 via the gas spray holes 16 in the shower plate 15, into the processing chamber 10 as a shower. High-frequency power of 150 to 200 watts is simultaneously applied from the high-frequency power supply 33 via the matching device 32 to the tubular electrode 31. In this case, the impedance adjuster 55 of the high-frequency electrode 51 is regulated to the desired preset impedance value. The effect of the magnetic field from the tubular magnets 34, 34 causes a magnetron discharge, and electrical charges are trapped in the space above the wafer 1 and a high density plasma is generated in the plasma generating region 30. The surface of the wafer 1 on the susceptor 40 is then plasma-processed by the high density plasma that was generated. The wafer transfer device then transfers the wafer 1 whose processing is now complete, to outside the processing chamber 10 in a procedure that is the reverse of the wafer carry-in procedure.

The controller 60 respectively controls the turning of power on and off to the high-frequency power supply 33, the adjust of the matching device 32, the opening and closing of the valve 19, the flow rate of the mass flow controller 20, the degree of valve opening of the pressure adjuster valve 24, the opening and closing of the valve 25, the stopping and starting of the vacuum pump 26, the raising and lowering of the susceptor elevating shaft 36, the opening and closing of the gate valve 27, and the turning of power on and off to the heater high-frequency power supply 47 for applying high-frequency power to the heater 45 of the susceptor 40.

The above embodiment renders the following effects.

1) The susceptor is prevented from acting as a source for contaminating the wafer, even if the susceptor is directly exposed to plasma under high temperatures of 550 degrees centigrade since the susceptor is made from quartz. Moreover, contamination of the wafer is prevented even if the entire rear surface of the wafer makes contact with the susceptor and therefore renders the effect that yield of the MMT apparatus and therefore the IC manufacturing method can be improved.

2) Control performance of the high-frequency electrode can be improved versus the surface voltage potential of the wafer, by setting the gap between the wafer lower surface and the high-frequency electrode to within 1.5 millimeters, rendering the effect of improving the MMT apparatus processing speed.

3) The processing temperature can be raised up to 800 degrees centigrade by forming the high-frequency electrode from platinum, therefore rendering the effect of improving the MMT apparatus processing speed.

4) Providing the gaps Sa and Sb between the high-frequency electrode and the main body of the susceptor, allows their thermal expansion differential to be absorbed by those gaps, even if the thermal expansion coefficient of the material (platinum) of the high-frequency electrode is greater than the thermal expansion coefficient of the susceptor main body material (quartz), rendering the effect that damage to the high-frequency electrode can be prevented.

5) The strength of the supporting plate where the supporting section is formed and the electrode arranging plate where the electrode arranging hole is formed, can be boosted by providing a pillar on the electrode arranging plate on the bottom level forming a portion of the susceptor main body, and by fixing the upper surface of the pillar to the lower surface of the supporting plate on the upper level, rendering the effect that damage to the supporting plate and the electrode arranging plate and therefore the susceptor main body can be prevented.

6) The side cross sectional surface area of each pillar can be set smaller by arranging multiple pillars uniformly on the bottom surface of the electrode arranging hole, so that surface area of the opening of the insertion hole of the high-frequency electrode for inserting the pillar can be made smaller, rendering the effect that the voltage distribution can be uniformly maintained across the entire high-frequency electrode.

7) The plate thickness t of the supporting hole of the supporting plate installed on the high-frequency electrode can be set to a thin dimension, by using the pillars to reinforce the susceptor main body, rendering the effect that the effect of the electrical field from the high-frequency electrode on the wafer can be enhanced.

8) The distance from the high-frequency electrode 51 to the supporting surface for supporting the wafer provided on the susceptor surface higher than the high-frequency electrode 51; can be set to a smaller distance than that from the high-frequency electrode 51 to the susceptor rear surface lower than the high-frequency electrode 51. Therefore, the distance from the high-frequency electrode 51 to the wafer supported on the susceptor can be reduced, to enhance the effect of the electrical field on the wafer, and also allow installing a heater within the susceptor lower than the high-frequency electrode 51, rendering the effect that the wafer can be directly heated from the susceptor 40 so that the wafer heating efficiency is improved.

9) Even if there is a large difference between the pressure within the space of the electrode arranging hole and the pressure of the processing chamber of the MMT apparatus, damage to the susceptor main body can be prevented by using pillar to boost the strength of the susceptor main body. In other words, even if there is a reduction in pressure within the processing chamber, the internal space within the susceptor main body can be connected with the outside atmosphere, rendering the effect that the air-tight seal structure can be simplified.

10) The strength of the susceptor main body decreases as the susceptor is heated to a high temperature, and therefore the increase of the strength of the susceptor main body can accommodate high temperature processing.

11) The high-frequency electrode can be easily installed in the electrode arranging hole where multiple pillars are provided by inserting each pillar into each insertion hole by forming multiple insertion holes in one metal plate serving as the high-frequency electrode. Moreover, the high-frequency electrode can be accurately installed in the electrode arranging hole without position deviations, rendering the effect that the cost of manufacturing the susceptor and therefore the MMT apparatus can be reduced.

12) A uniform voltage distribution can be maintained across the entire high-frequency electrode by arranging the pillar of the electrode arranging hole and the pillar of the high-frequency electrode uniformly across the entire, rendering the effect that the process distribution for the wafer can be uniform across the entire surface.

13) A heater can heat the wafer supported on the susceptor by installing the heater below the high-frequency electrode on the susceptor main body, rendering the effect that the wafer temperature can be directly regulated.

The present invention is not limited to the above embodiments, and includes variations of different types not departing from the spirit or scope of this invention.

For example, the heater arranging plate and the electrode arranging plate may be formed from an insulating material such as aluminum nitride. In other words, just the supporting plate that makes up the supporting section for supporting the wafer can be formed from quartz, and other sections of the susceptor main body may be formed from an insulation material other than quartz such as aluminum nitride.

The heater for heating the wafer is not limited to a position within the susceptor main body.

The description of the above embodiments utilized an MMT apparatus, however the present invention is not limited to an MMT apparatus, and is applicable to semiconductor manufacturing device such as plasma processing devices containing an electrode in the susceptor.

The invention claimed is:

1. A semiconductor manufacturing device comprising a processing chamber including a susceptor for supporting a substrate, wherein the susceptor has a main body containing a wall forming inside an electrode arranging space substantially flat and parallel to the substrate and multiple pillars joining the bottom and ceiling of the wall; and a high-frequency electrode having at least one insertion hole for receiving at least one of the multiple pillars, the high-frequency electrode being installed with a gap between the electrode and the at least one of the multiple pillars within the electrode arranging space.

2. A semiconductor manufacturing device according to claim 1, wherein the distance from the high frequency electrode to the supporting surface for supporting the substrate provided on the susceptor surface higher than the high-frequency electrode, is set smaller than the distance from the high-frequency electrode to the susceptor rear surface lower than the high-frequency electrode.

3. A semiconductor manufacturing device according to claim 1 or claim 2, wherein the electrode arranging space is insulated from the atmosphere in the processing chamber and is connected to the atmosphere outside the processing chamber.

4. A semiconductor manufacturing device according to claim 1 or claim 2, wherein the high-frequency electrode is comprised of a plate formed with insertion holes where the pillars are inserted.

5. A method for manufacturing semiconductor devices comprising the steps of:
 supporting a substrate on a susceptor installed in a processing chamber,
 supplying and exhausting a process gas to and from the processing chamber, and
 performing plasma processing of the substrate by the susceptor having a main body containing a wall forming inside an electrode arranging space substantially flat and parallel to the substrate and multiple pillars joining the bottom and ceiling of the wall; and a high-frequency electrode having at least one insertion hole for receiving at least one of the multiple pillars, the high-frequency electrode being installed with a gap between the electrode and the at least one of the multiple pillars within the electrode arranging space.

* * * * *